United States Patent
Sakurai

(10) Patent No.: US 12,322,326 B2
(45) Date of Patent: Jun. 3, 2025

(54) DRIVE CONTROL DEVICE, DRIVE CONTROL METHOD, INFORMATION PROCESSING SYSTEM, AND INFORMATION PROCESSING METHOD FOR INFORMATION PROCESSING SYSTEM

(71) Applicant: SONY GROUP CORPORATION, Tokyo (JP)

(72) Inventor: Hisao Sakurai, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 18/555,781

(22) PCT Filed: Feb. 1, 2022

(86) PCT No.: PCT/JP2022/003724
§ 371 (c)(1),
(2) Date: Oct. 17, 2023

(87) PCT Pub. No.: WO2022/230276
PCT Pub. Date: Nov. 3, 2022

(65) Prior Publication Data
US 2024/0203328 A1  Jun. 20, 2024

(30) Foreign Application Priority Data
Apr. 30, 2021 (JP) ................................. 2021-077235

(51) Int. Cl.
*G09G 3/32* (2016.01)

(52) U.S. Cl.
CPC ......... *G09G 3/32* (2013.01); *G09G 2300/026* (2013.01); *G09G 2300/06* (2013.01); *G09G 2330/02* (2013.01)

(58) Field of Classification Search
CPC .............. G09G 3/32; G09G 2300/026; G09G 2300/06; G09G 2330/02; G09G 3/20; H01L 33/00; Y02B 20/40
See application file for complete search history.

(56) References Cited

U.S. PATENT DOCUMENTS

2014/0049528 A1* 2/2014 Koo ..................... G09G 3/3696
345/208
2015/0243208 A1 8/2015 Kim et al.
(Continued)

FOREIGN PATENT DOCUMENTS

JP  2000-056727 A  2/2000
JP  2003-255915 A  9/2003
(Continued)

OTHER PUBLICATIONS

International Search Report and Written Opinion of PCT Application No. PCT/JP2022/003724, issued on Apr. 26, 2022, 09 pages of ISRWO.

*Primary Examiner* — Premal R Patel
(74) *Attorney, Agent, or Firm* — CHIP LAW GROUP

(57) ABSTRACT

The present disclosure relates to a drive control device, a drive control method, an information processing system, and an information processing method for an information processing system capable of suppressing generation of an abnormal sound in a passive-matrix driven LED display device. A blanking interval between frames is made shorter than a time set according to a display standard, and the blanking interval ends before a ripple voltage rises. Accordingly, suppressing a rise in the ripple voltage caused by a reduction in current flow through LEDs during the blanking interval lowers a voltage applied to an MLCC, and suppressing distortion of a substrate resulting from expansion or contraction of the MLCC caused by the voltage application (Continued)

suppresses generation of an abnormal sound. This disclosure is applicable to a passive-matrix driven LED display device.

20 Claims, 14 Drawing Sheets

(56) References Cited

U.S. PATENT DOCUMENTS

| | | | |
|---|---|---|---|
| 2019/0147795 A1 | 5/2019 | Yao | |
| 2020/0312228 A1* | 10/2020 | Lee | G09G 3/32 |
| 2022/0139301 A1* | 5/2022 | Kim | G09G 3/3233 |
| | | | 345/690 |

FOREIGN PATENT DOCUMENTS

| | | |
|---|---|---|
| JP | 2003-280599 A | 10/2003 |
| JP | 2010-046343 A | 3/2010 |

* cited by examiner

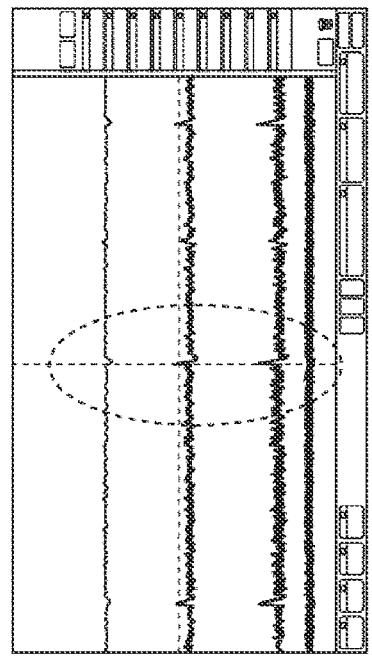
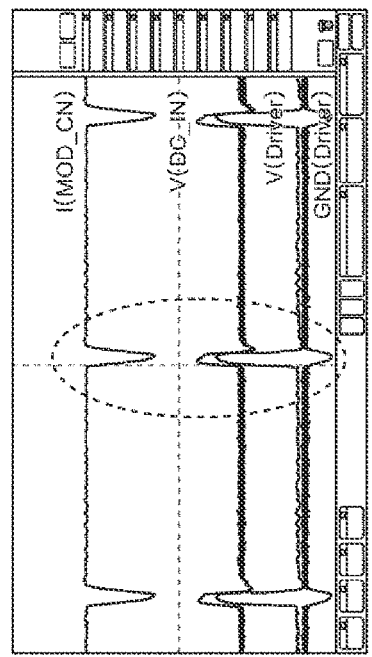
FIG. 14

DRIVE CONTROL DEVICE, DRIVE CONTROL METHOD, INFORMATION PROCESSING SYSTEM, AND INFORMATION PROCESSING METHOD FOR INFORMATION PROCESSING SYSTEM

CROSS REFERENCE TO RELATED APPLICATIONS

This application is a U.S. National Phase of International Patent Application No. PCT/JP2022/003724 filed on Feb. 1, 2022, which claims priority benefit of Japanese Patent Application No. JP 2021-077235 filed in the Japan Patent Office on Apr. 30, 2021. Each of the above-referenced applications is hereby incorporated herein by reference in its entirety.

TECHNICAL FIELD

The present disclosure relates to a drive control device, a drive control method, an information processing system, and an information processing method for an information processing system, and more particularly, to a drive control device, a drive control method, an information processing system, and an information processing method for an information processing system capable of suppressing generation of an abnormal sound in a direct view light emitting diode (LED) display at low cost.

BACKGROUND ART

A market for direct view displays using light emitting diodes (LEDs) has been recently growing.

Among them, a tiling display uses a substrate (LED module substrate: hereinafter, also referred to as a module substrate) on which LEDs are mounted, but an abnormal sound such as a "buzz sound" or a "beeping sound" may occur in the module substrate or an internal power supply system.

This phenomenon is mainly caused by noise generated from multilayer ceramic capacitors (MLCCs) mounted as bypass capacitors of a power supply line or vibrations, at a specific frequency, of coils or the like used in the power supply system.

Measures have been taken so far against noise (abnormal sound) generated from the MLCCs by adopting low-distortion MLCCs (low-noise products) or mounting solid capacitors such as tantalum capacitors with which the MLCCs are replaced.

In general, coils are subjected to impregnation treatment or the like to suppress vibrations.

Furthermore, a technology has been proposed in which a plurality of bypass capacitors is provided to generate vibrations having opposite phases, thereby suppressing the generation of a vibration sound (see Patent Document 1).

CITATION LIST

Patent Document

Patent Document 1: Japanese Patent Application Laid-Open No. 2002-232110.

SUMMARY OF THE INVENTION

Problems to be Solved by the Invention

In the technology disclosed in Patent Document 1, however, a mechanism that actually generates vibrations having opposite phases has a very complicated configuration.

Furthermore, even if the mechanism that generates vibrations having opposite phases can be made, a device configuration doubles. In particular, a large number of components such as bypass capacitors are used, and the cost of the entire set increases even if the unit price of each component is low.

Moreover, the tantalum capacitor fails in short mode, and thus there is a possibility that the use of a large number of tantalum capacitors may lower product quality.

The present disclosure has been made in view of such circumstances, and in particular, it is an object of the present disclosure to allow suppression of generation of an abnormal sound in a direct view light emitting diode (LED) display at low cost.

Solutions to Problems

A drive control device according to a first aspect of the present disclosure includes a light emission control unit configured to control light emission of light emitting diodes (LEDs) constituting an LED array, in which the light emission control unit performs control to make a length of a period during which the LEDs are off shorter than a time indicated by an input signal.

A drive control method according to the first aspect of the present disclosure includes a light emission control step of controlling light emission of light emitting diodes (LEDs) constituting an LED array, in which, in a process of the light emission control step, a length of a period during which the LEDs are off is controlled to be shorter than a time indicated by an input signal.

In the first aspect of the present disclosure, the light emission of the light emitting diodes (LEDs) constituting the LED array is controlled, and the length of the period during which the LEDs are off is controlled to be shorter than the time indicated by the input signal.

An information processing system according to a second aspect of the present disclosure includes a display including display units, each of the display units including light emitting diodes (LEDs) arranged in an array and a drive control device configured to control driving of the LEDs, and a distributor configured to receive input of a video signal, perform predetermined signal processing on the video signal, and distribute the video signal among the display units, in which the drive control device includes a light emission control unit configured to control light emission of the LEDs, and the light emission control unit performs control to make a length of a period during which the LEDs are off shorter than a time indicated by an input signal.

An information processing method for an information processing system according to the second aspect of the present disclosure, the information processing system including a display including display units, each of the display units including light emitting diodes (LEDs) arranged in an array and a drive control device configured to control driving of the LEDs, and a distributor configured to receive input of a video signal, perform predetermined signal processing on the video signal, and distribute the video signal among the display units, the information processing method including a light emission control step of controlling light emission of the LEDs by the drive control device, in which, in a process of the light emission control step, a length of a period during which the LEDs are off is controlled to be shorter than a time indicated by an input signal.

In the second aspect of the present disclosure, provided are the display including the display units, each of the display units including the light emitting diodes (LEDs) arranged in an array and the drive control device configured to control driving of the LEDs, and the distributor configured to receive input of the video signal, perform the predetermined signal processing on the video signal, and distribute the video signal among the display units, and the drive control device controls the light emission of the LEDs to make the length of the period during which the LEDs are off shorter than the time indicated by the input signal.

BRIEF DESCRIPTION OF DRAWINGS

FIG. 14 is a diagram describing an effect in a case where the blanking interval is set shorter.

MODE FOR CARRYING OUT THE INVENTION

Figure 1:
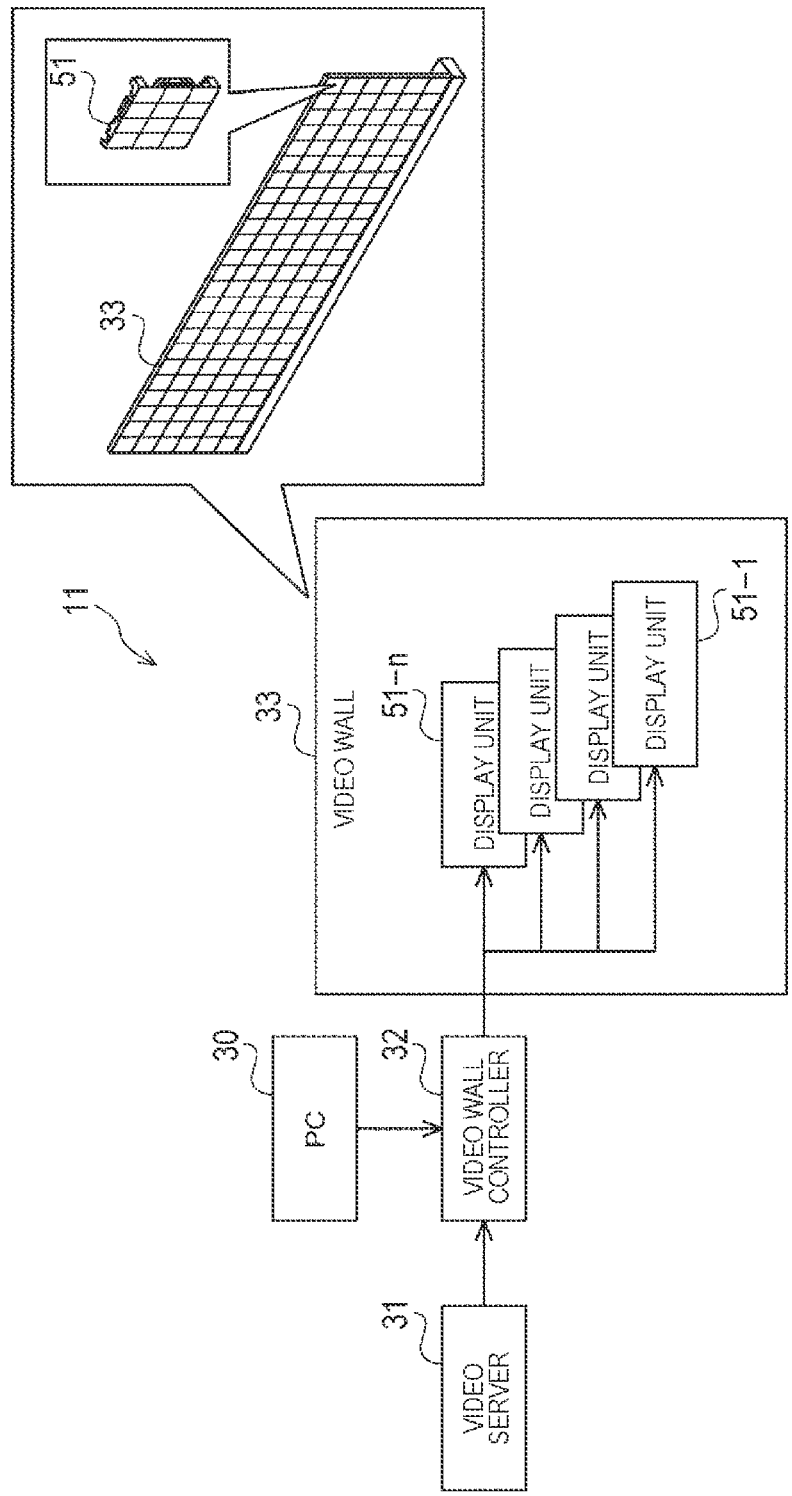
FIG. 1 is a diagram describing a configuration example of a display system of the present disclosure.

Hereinafter, a preferred embodiment of the present disclosure will be described in detail with reference to the accompanying drawings. Note that, in present specification and drawings, components having substantially the same functional configuration are denoted by the same reference numerals to avoid the description from being redundant.

Hereinafter, modes for carrying out the present technology will be described. The description will be given in the following order.

1. Configuration Example of Display System
2. Detailed Configuration of Video Wall Controller and Display Unit
3. Configuration Example of LED Array
4. Ripple Voltage
5. Principle of How Abnormal Sound Occurs
6. Blanking Interval
7. Setting of Length of Blanking Interval
8. Display Processing
9. Driver Control Processing by Display Unit <<1. Configuration Example of Display System>>

In particular, the present disclosure is intended to suppress generation of an abnormal sound in a direct view light emitting diode (LED) display at low cost.

FIG. 1 depicts a configuration example of a display system to which the technology of the present disclosure is applied.

A display system 11 in FIG. 1 is configured to display video content on a large display including a plurality of display units arranged in a tiled layout.

More specifically, the display system 11 includes a personal computer (PC) 30, a video server 31, a video wall controller 32, and a video wall 33.

The personal computer (PC) 30 is a general-purpose computer, and the PC 30 receives the input of user operation and supplies a command corresponding to a detail of the operation to the video wall controller 32.

The video server 31 includes, for example, a server computer or the like, and supplies data of a video signal such as video content to the video wall controller 32.

The video wall controller 32 operates in response to the command supplied from the PC 30, and distributes the data of the video signal of the video content among display units 51-1 to 51-$n$ constituting the video wall 33 to cause the display units 51-1 to 51-$n$ to display the data.

Note that, in a case where it is not necessary to distinguish the display units 51-1 to 51-$n$, the display units are simply referred to as a display unit 51.

As depicted in the upper right part of FIG. 1, the video wall 33 corresponds to the display units 51-1 to 51-$n$ arranged in a tiled layout, the display units 51-1 to 51-$n$ each having pixels including LEDs arranged in an array, and images individually displayed by the display units 51 are combined in a tiled layout, so that one entire image is displayed on the video wall 33.

The video wall controller 32 performs predetermined signal processing on the data of the video signal of the video content supplied from the video server 31, distributively supplies the data in accordance with the arrangement of the display units 51-1 to 51-$n$, controls their respective displays of the display units 51-1 to 51-$n$, and controls the video wall 33 to display one entire image.

Note that the video wall controller 32 and the video wall 33 may be integrated with each other, or may be integrated into a display device (information processing system).

<<2. Detailed Configuration of Video Wall Controller and Display Unit>>

Next, a detailed configuration example of the video wall controller 32 and the display unit 51 will be described with reference to FIG. 2.

The video wall controller 32 includes a local area network (LAN) terminal 71, a high definition multimedia interface (HDMI) (registered trademark) terminal 72, a display port (DP) terminal 73, a digital visual interface (DVI) terminal 74, a network interface (IF) 75, a micro processor unit (MPU) 76, a signal input IF 77, a signal processing unit 78, a dynamic random access memory (DRAM) 79, a signal distribution unit 80, and output IFs 81-1 to 81-$n$.

The local area network (LAN) terminal 71 is, for example, a connection terminal of a LAN cable or the like, and the LAN terminal 71 establishes communication with the personal computer (PC) 30 over a LAN, the personal computer (PC) 30 being operated by the user to supply a control command or the like corresponding to a detail of the operation to the video wall controller 32, and supplies the input control command or the like to the MPU 76 via the network IF 75.

Note that the LAN terminal 71 may have a configuration adapted to physical connection with a wired LAN cable, or may have a configuration adapted to connection with a so-called wireless LAN implemented by wireless communication.

The MPU 76 receives the input of the control command supplied from the PC 30 via the LAN terminal 71 and the network IF 75, and supplies a control signal corresponding to the received control command to the signal processing unit 78.

The HDMI terminal 72, the DP terminal 73, and the DVI terminal 74 each serve as an input terminal of the data of the video signal, and is connected to, for example, the server computer functioning as the video server 31, and supplies the data of the video signal to the signal processing unit 78 via the signal input IF 77.

Figure 2:
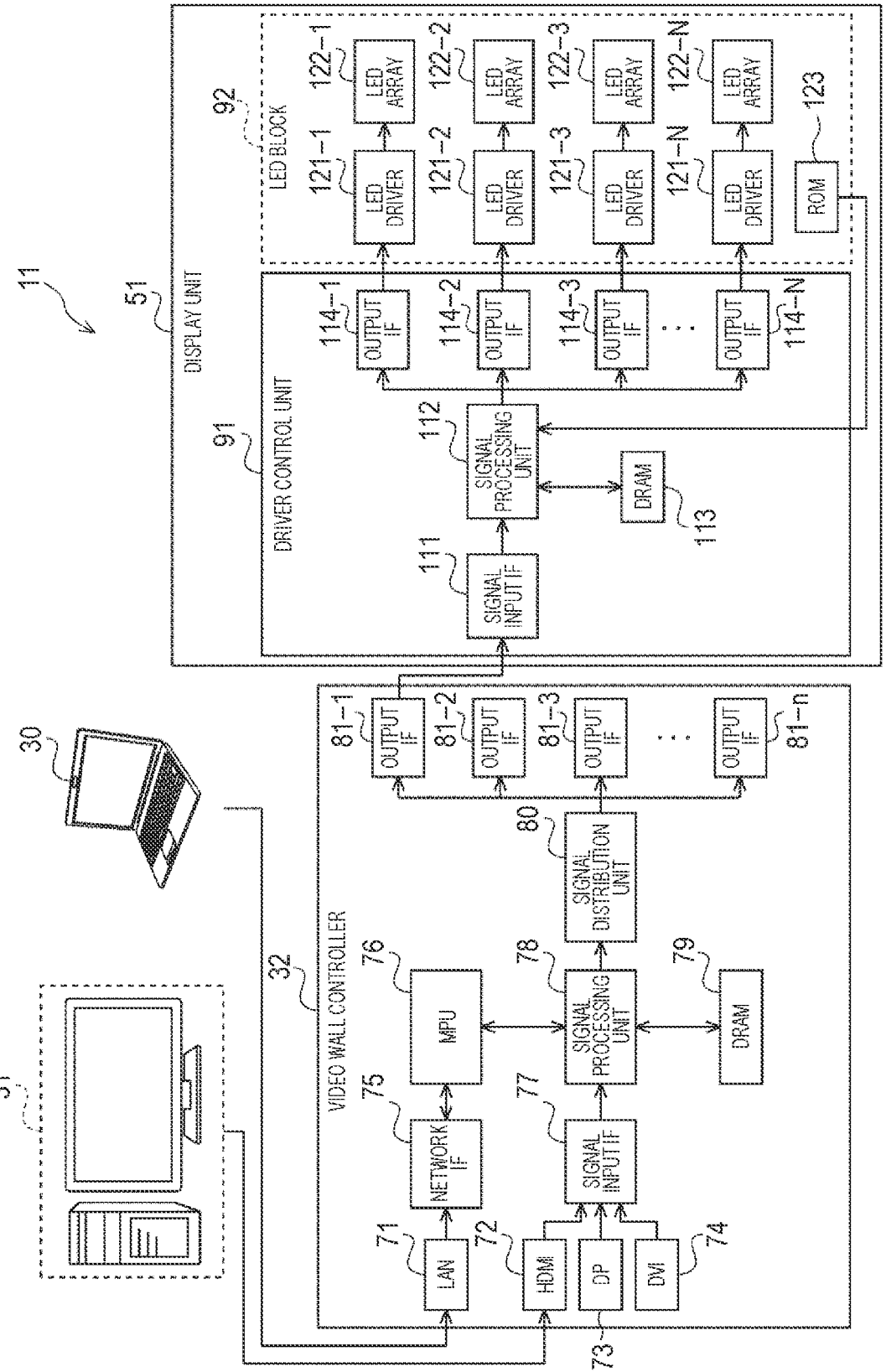
FIG. 2 is a diagram describing a configuration example of a video wall controller and a display unit in FIG. 1.

Note that, although FIG. 2 depicts an example where the video server 31 and the HDMI terminal 72 are connected, any one of the HDMI terminal 72, the DP terminal 73, or the DVI terminal 74 may be selected and connected as necessary because the HDMI terminal 72, the DP terminal 73, and the DVI terminal 74 have different standards but basically have similar functions.

The signal processing unit 78 adjusts color temperature, contrast, brightness, and the like of the data of the video signal supplied via the signal input IF 77 on the basis of the control signal supplied from the MPU 76, and supplies the data to the signal distribution unit 80. At this time, the signal processing unit 78 develops the data of the video signal in the connected DRAM 79, performs signal processing based on the control signal, and supplies a result of the signal processing to the signal distribution unit 80 as necessary.

The signal distribution unit 80 distributes the data of the video signal subjected to the signal processing and supplied from the signal processing unit 78 and distributively transmits the data to the display units 51-1 to 51-n via the output IFs 81-1 to 81-n.

The display unit 51 includes a driver control unit 91 and an LED block 92.

The driver control unit 91 supplies the data of the video signal for controlling light emission of LEDs constituting LED arrays 122-1 to 122-N to a plurality of LED drivers 121-1 to 121-N constituting the LED block 92.

More specifically, the driver control unit 91 includes a signal input IF 111, a signal processing unit 112, a DRAM 113, and output IFs 114-1 to 114-N.

The signal input IF 111 receives the input of the data of the video signal supplied from the video wall controller 32 and supplies the data to the signal processing unit 112.

The signal processing unit 112 corrects color and luminance for each display unit 51 on the basis of the data of the video signal supplied from the signal input IF 111, generates data for setting light emission intensity of each LED constituting the LED arrays 122-1 to 122-N, and distributively supplies the data to the LED drivers 121-1 to 121-N of the LED block 92 via the output IFs 114-1 to 114-N.

More specifically, the data of the video signal further contains information such as a length of a blanking interval specified in a general standard. Therefore, with the information such as the length of the blanking interval contained in the video data signal taken into account, the signal processing unit 112 generates data for setting the number of LED rows (number of Scan lines), the number of repetitions of light emission (cyclic number) for one frame, and the light emission intensity of each LED constituting the LED arrays 122-1 to 122-N, and distributively supplies the data to the LED drivers 121-1 to 121-N of the LED block 92 via the output IFs 114-1 to 114-N.

The LED block 92 includes the LED drivers 121-1 to 121-N, the LED arrays 122-1 to 122-N, and a read only memory (ROM) 123.

The LED drivers 121-1 to 121-N each perform pulse width modulation (PWM) control on the light emission of the LEDs arranged in an array constituting a corresponding one of the LED arrays 122-1 to 122-N on the basis of the data for setting the light emission intensity of the LEDs 141, the data containing the video signal supplied from the driver control unit 91.

The ROM 123 stores substrate mounting information containing the type (capacity), the number, and the like of capacitors such as MLCCs mounted on a substrate 153 (FIG. 4) constituting each LED block 92, and the signal processing unit 112 reads, upon energization, the substrate mounting information from the ROM 123 and sets processing to be performed on the video signal. More specifically, the signal processing unit 112 sets the length of the blanking interval shorter than the blanking interval specified in the general standard on the basis of the substrate mounting information read from the ROM 123 upon energization. Details of how to set the blanking interval will be described later.

<<3. Configuration Example of LED Array>>

Figure 3:
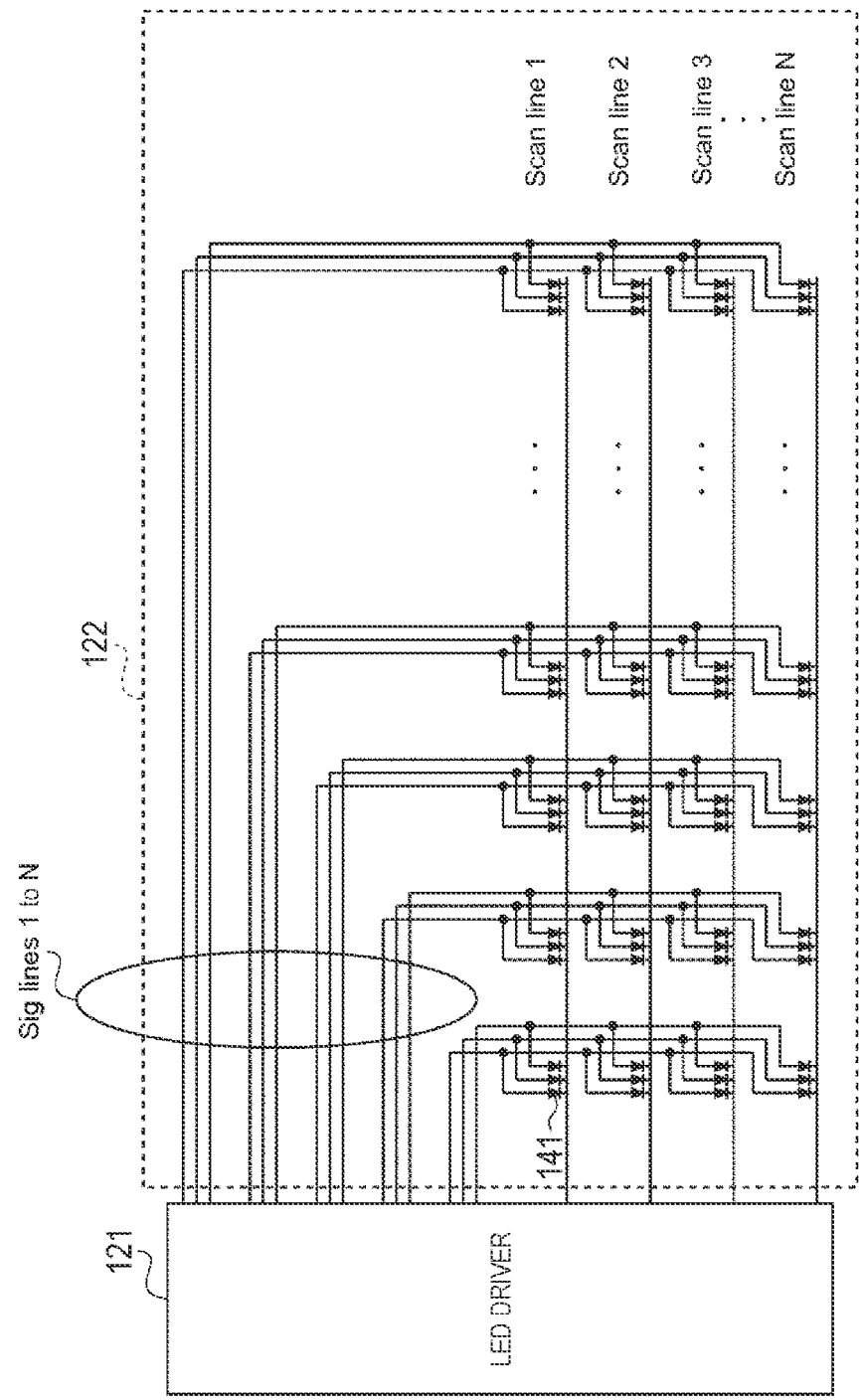
FIG. 3 is a diagram describing a configuration example of an LED array.

Next, a configuration example of the LED array 122 will be described with reference to FIG. 3. FIG. 3 depicts a configuration example of the LED array 122 with LED drive connections of a passive-matrix drive type. Therefore, the light emission of the LEDs 141 of the LED array 122 is controlled under a passive-matrix drive scheme.

In the LED array 122 in FIG. 3, the LEDs 141 of a common cathode type are arranged in an array and are each connected to a Sig line (luminance control wiring) laid in a vertical direction and a Scan line (row selection wiring) laid in a horizontal direction.

In the LED array 122 in FIG. 3, when a Scan line 1 is set at a predetermined fixed potential to become ON, a current is supplied to the LEDs through the Sig line to bring the LEDs into a light emission operation. Note that the predetermined fixed potential is typically, but not limited to, GND=0 V potential.

<<4. Ripple Voltage>>

Next, a ripple voltage causing an abnormal sound will be described with reference to FIGS. 4 to 7. Then, first, a power supply configuration for supplying power to the display units 51-1 to 51-n will be described.

Figure 4:
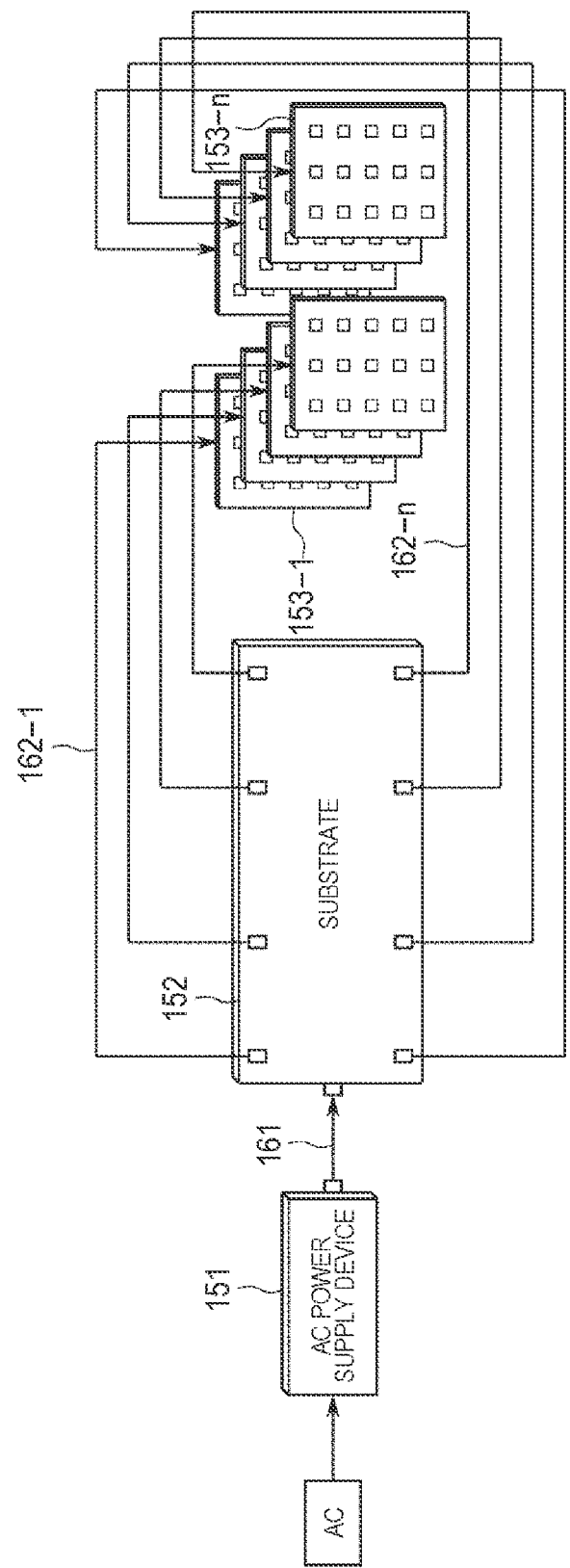
FIG. 4 is a diagram describing a principle of how an abnormal sound occurs.

FIG. 4 depicts an outline of the power supply configuration for supplying power to the display units 51-1 to 51-n.

The power supply configuration in FIG. 4 includes an alternating current (AC) power supply device 151 that receives the input of AC power supply and supplies power to a subsequent stage, a substrate/wiring (substrate on which wiring is formed) 152 including various circuits, wiring, and the like constituting the video wall controller 32 arranged at their respective positions, and substrates/wiring (substrate on which wiring is formed) 153-1 to 153-n including various circuits, wiring, and the like constituting each of the display units 51-1 to 51-n constituting the video wall 33 arranged at their respective positions.

Furthermore, the AC power supply device 151 and the substrate 152 are electrically connected via wiring 161, and the substrate 152 and each of the substrates 153-1 to 153-n are electrically connected via wiring 162-1 to 162-n.

Figure 5:
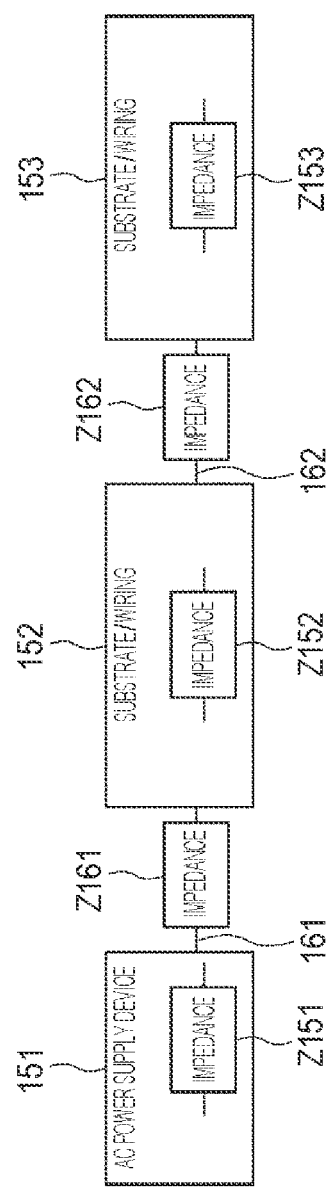
FIG. 5 is a diagram describing a principle of how an abnormal sound occurs.

As depicted in FIG. 5, the AC power supply device 151, the substrates 152 and 153, and the wiring 161 and 162-1 to 162-$n$ have impedances Z151, Z152, Z153, Z161, and Z162 therein, respectively.

Figure 6:
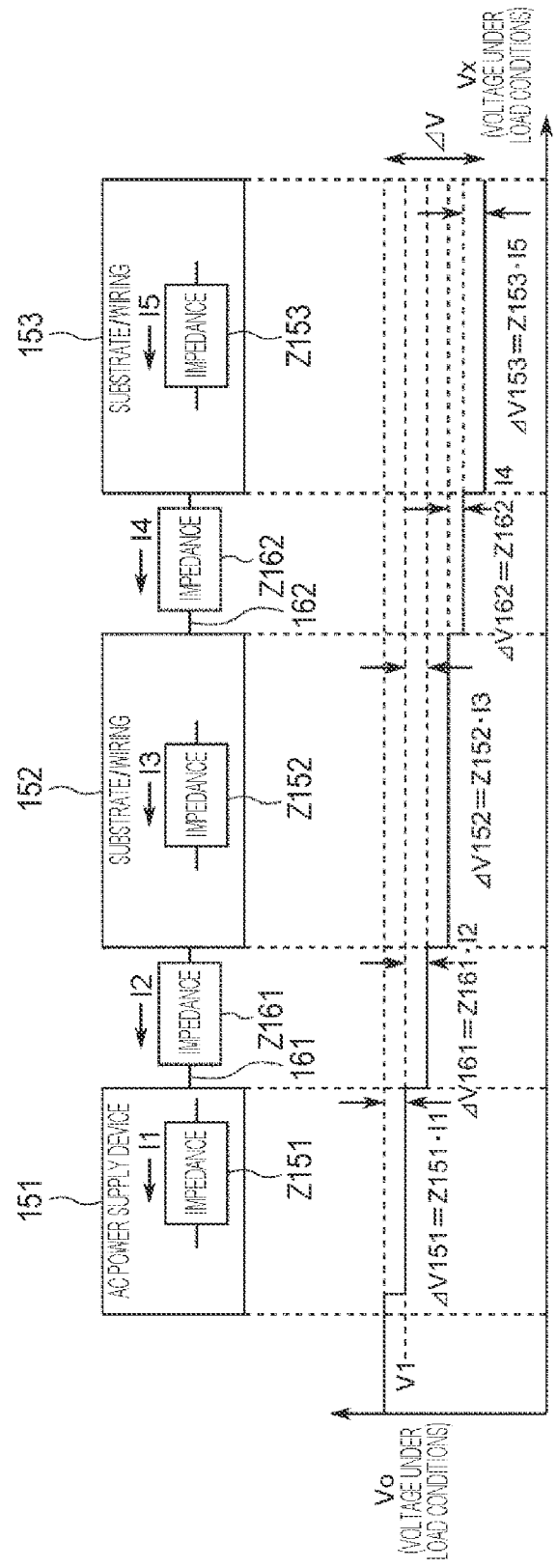
FIG. 6 is a diagram describing the principle of how an abnormal sound occurs.

Therefore, as depicted in FIG. 6, in a case where it is assumed that the AC power supply device 151 receives the input of AC power supply of a voltage V0 under no-load conditions, an output voltage of the AC power supply device 151 drops by a voltage ΔV151 (=Z151×I1 (in the drawing, expressed as Z151·I1, and the same applies to the following)) corresponding to the impedance Z151 relative to the voltage V0, where I1 denotes an internal current.

Furthermore, the wiring 161 similarly undergoes a voltage drop by a voltage Δ161 (=Z161×I1) corresponding to the impedance Z161, where I2 denotes an internal current.

Moreover, the substrate 152 similarly undergoes a voltage drop by a voltage Δ152 (=Z152×I3) corresponding to the impedance Z152, where I3 denotes an internal current.

Furthermore, the wiring 162 similarly undergoes a voltage drop by a voltage Δ162 (=Z162×I4) corresponding to the impedance Z162, where I4 denotes an internal current.

Moreover, the substrate 153 similarly undergoes a voltage drop by a voltage Δ153 (=Z153×I5) corresponding to the impedance Z153, where I5 denotes an internal current.

As a result, the power supply voltage V0 supplied from the AC power supply device 151 drops by a total voltage ΔV (=ΔV151+ΔV161+ΔV152+ΔV162+ΔV153) of the AC power supply device 151, the substrates 152 and 153, and the wiring 161 and 162, the voltage ΔV corresponding to a difference between the power supply voltage V0 and a voltage Vx applied to the substrate 153.

Figure 7:
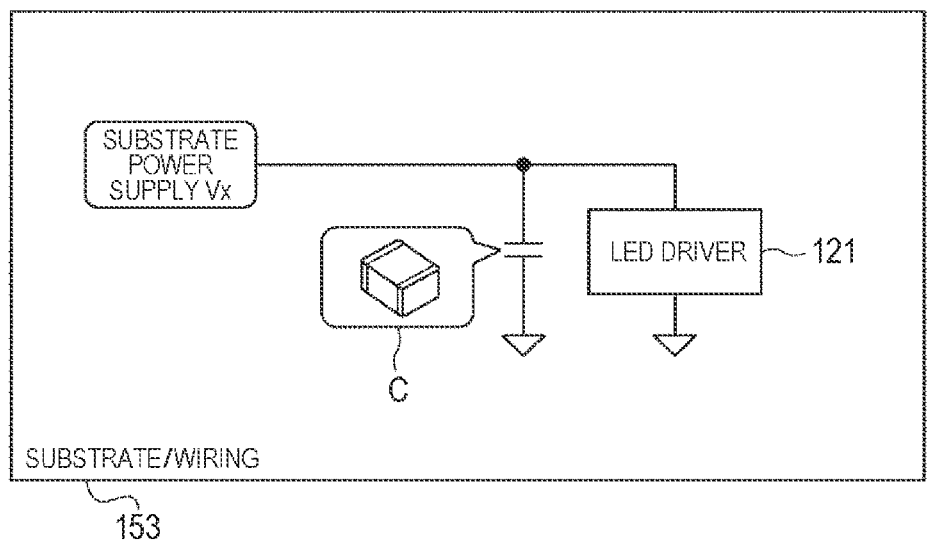
FIG. 7 is a simplified circuit diagram describing a circuit configuration of a substrate.

Furthermore, when the circuit configuration formed on the substrate 153 is expressed by a simple circuit diagram, as depicted in FIG. 7, the LED driver 121 and a capacitance C such as an MLCC provided on the substrate 153 can be regarded as circuits connected in parallel.

Therefore, in a case where the LED 141 is emitting light, a current flows through the LED driver 121 and the MLCC, that is, it is under load conditions, and the voltage Vx obtained as a result of the voltage drop by the voltage ΔV relative to the power supply voltage V1 is applied to the LED driver 121.

On the other hand, in a case where the LED 141 is off, the current flowing through the LED driver 121 and the MLCC is reduced, that is, it is under no-load conditions, so that the voltage drop corresponding to the voltage ΔV does not occur, and the voltage V1 is applied to the LED driver 121.

That is, the voltage applied to the LED driver 121 and the MLCC changes to the voltage V0 or the voltage Vx in a manner that depends on whether or not the voltage drop by the voltage ΔV occurs according to the light emission state of the LED 141. Here, when the voltage temporarily changes from the voltage Vx under load conditions to the voltage V0 under no-load conditions, the voltage ΔV corresponding to the voltage drop that looks like a rectangular wave is a ripple voltage ΔV. The ripple voltage ΔV causes an abnormal sound. Note that a principle of how an abnormal sound is caused by the ripple voltage ΔV will be described later.

<<5. Principle of How Abnormal Sound Occurs>>

Next, in describing the principle of how an abnormal sound is caused by the ripple voltage ΔV, voltage distortion due to the MLCC mounted on the substrate 153 will be described. Note that the description will be given here with the substrate 153 as an example, but the same applies to the substrate 152.

Figure 8:
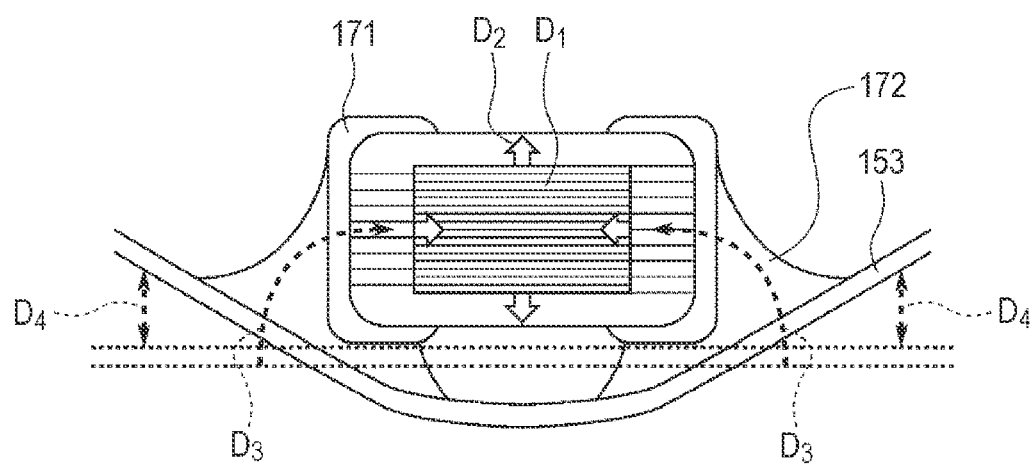
FIG. 8 is a diagram describing distortion of an MLCC.

FIG. 8 is a side cross-sectional view for describing distortion that occurs when a voltage is applied to an MLCC 171 connected onto the substrate 153 by a connecting part 172 including solder, an adhesive, or the like.

The MLCC 171 has a configuration in which ceramic ferroelectrics are stacked on top of each other in the vertical direction in the drawing, and when a voltage is applied, the MLCC expands as indicated by a black arrow D2 pointing in a direction (vertical direction in the drawing) parallel to an electric field application direction that is the vertical direction and is indicated by an arrow D1 in the drawing, and contracts as indicated by a black arrow D2 pointing in the horizontal direction in the drawing that is orthogonal to the arrow D1 indicating the electric field application direction in the drawing.

Accordingly, as indicated by a dotted arrow D3, the substrate 153 is drawn toward side surface portions of the MLCC 171 with the connecting part 172 that fixes the MLCC 171 onto the substrate 153 interposed between the substrate 153 and the MLCC 171.

As a result, as indicated by an arrow D4, the substrate 153 is distorted (warped) into a downward convex shape in the drawing with a portion where the MLCC 171 is bonded to the substrate 153 as a center.

That is, as depicted in FIG. 8, when the ripple voltage ΔV is generated, the voltage is applied to the MLCC 171, the substrate 153 is warped (distorted) as depicted in FIG. 8, and when the ripple voltage ΔV is eliminated, no voltage is applied to the MCLL 171, the substrate 153 returns to a flat state, and the distortion is eliminated.

As described above, the substrate 153 becomes distorted or flat in a manner that depends on whether or not the ripple voltage ΔV is generated, so that an abnormal sound is generated from the substrate 153.

<<6. Blanking Interval>>

On the other hand, a standard for displaying images on display devices stipulates that a display image is displayed, frame by frame, at a predetermined frequency in order to be compatible with a standard established for conventional cathode-ray tube display devices.

According to this stipulation, a blanking interval during which no image is displayed is set between frames, that is, between when the last line of the previous frame is displayed and when the first line of the next frame is displayed.

Figure 9:
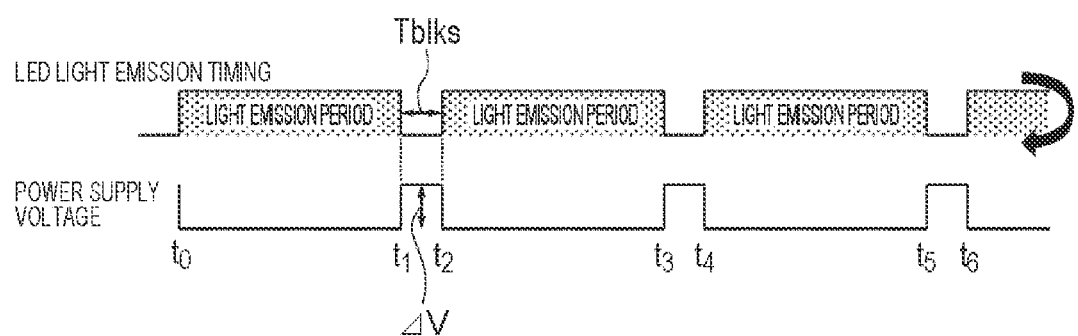
FIG. 9 is a timing chart describing an original blanking interval.

That is, as indicated by a waveform of LED light emission timing in the upper part of FIG. 9, the LED driver 121 causes a current for causing the LED 141 to emit light to flow during a period from t0 to t1, a period from t2 to t3, a period from t4 to t5, and the like, which are light emission periods of the LED 141 during which an image is displayed frame by frame.

On the other hand, the LED 141 is off during a period from t1 to t2, a period from t3 to t4, a period from t5 to t6, and the like, which are blanking intervals Tblks between frames during which the flow of the current for light emission becomes substantially zero.

Therefore, the voltage applied to the MLCC 171 varies in a manner that depends on the presence or absence of the current for causing the LED 141 to emit light as indicated by a waveform of the power supply voltage in the lower part of FIG. 9, so that, during the blanking interval Tblks, the ripple voltage ΔV as indicated by the rectangular wave is generated.

As a result, during the blanking interval Tblks, the voltage applied to the MLCC 171 varies every time the ripple voltage ΔV is generated, the substrate 153 is distorted accordingly, and the distortion generates an abnormal sound.

Figure 10:
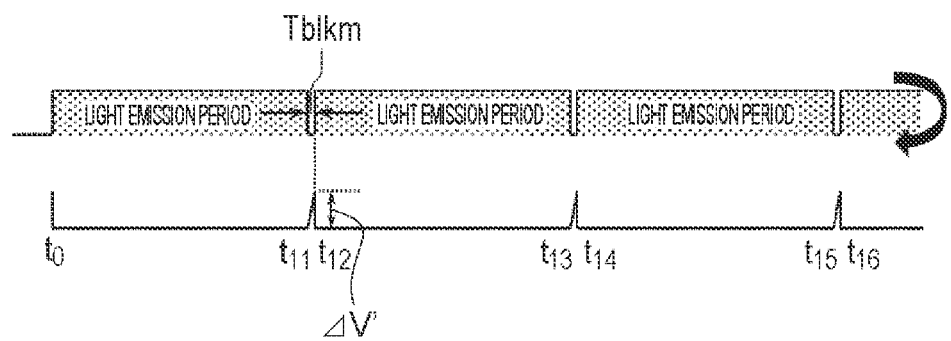
FIG. 10 is a timing chart describing a blanking interval of the present disclosure.

Therefore, in the present disclosure, as depicted in FIG. 10, setting the blanking interval Tblks to a shorter blanking interval Tblkm (<Tblks) to lower the generated ripple voltage to a voltage ΔV' (<ΔV) lowers the voltage applied to the MLCC 171 to suppress the distortion of the substrate 153 and suppress the generation of an abnormal sound caused by the distortion.

Figure 11:
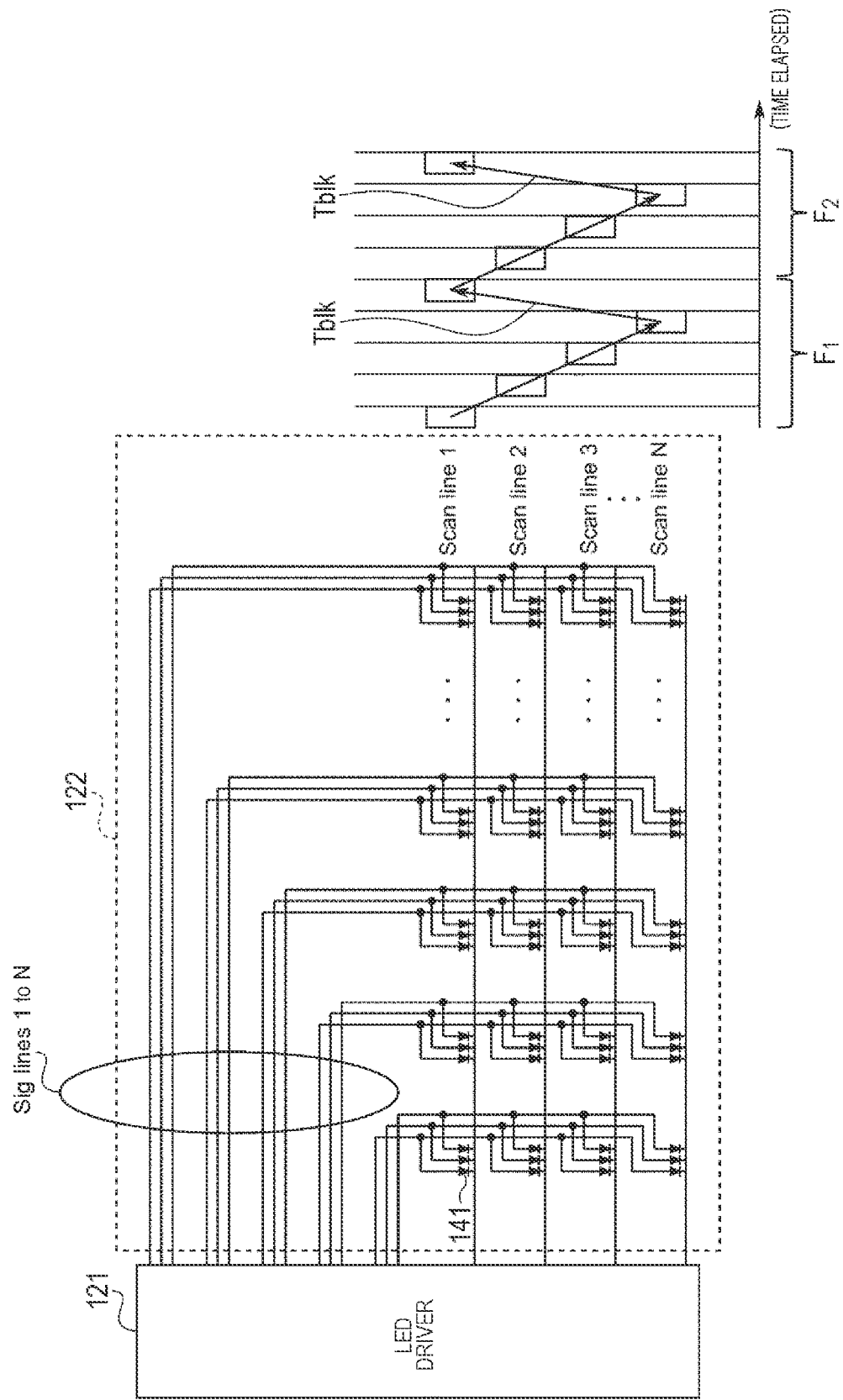
FIG. 11 is a timing chart describing light emission timing for each row of the LED array.

Here, the blanking interval will be described in more detail with reference to FIGS. 11 and 12. In FIG. 11, the left part is a configuration diagram of the LED driver 121 and the LED array 122 described with reference to FIG. 3, and the right part shows light emission timing for the LEDs constituting the LED array 122 for each row (for each Scan line).

That is, as indicated by an arrow pointed obliquely downward in the right part of FIG. 11, the LED driver 121 repeats, for each frame, a process of sequentially emitting light, row by row, from the top to the bottom, that is, from a Scan line 1 to a Scan line N.

Note that a rectangular portion in the right part of FIG. 11 through which the arrow pointed obliquely downward passes indicates the light emission timing of each line of frames F1, F2, . . . , and indicates that the LEDs emit light row by row in time series.

For example, when the light emission timing of the Scan line N of the frame F1 ends, as indicated by the arrow pointed obliquely upward, the position of the light emitting row changes from the Scan line N that is the last line of the frame F1 to the Scan line 1 that is the first line of the next frame F2. At this timing, the blanking interval Tblk is set.

Figure 12:
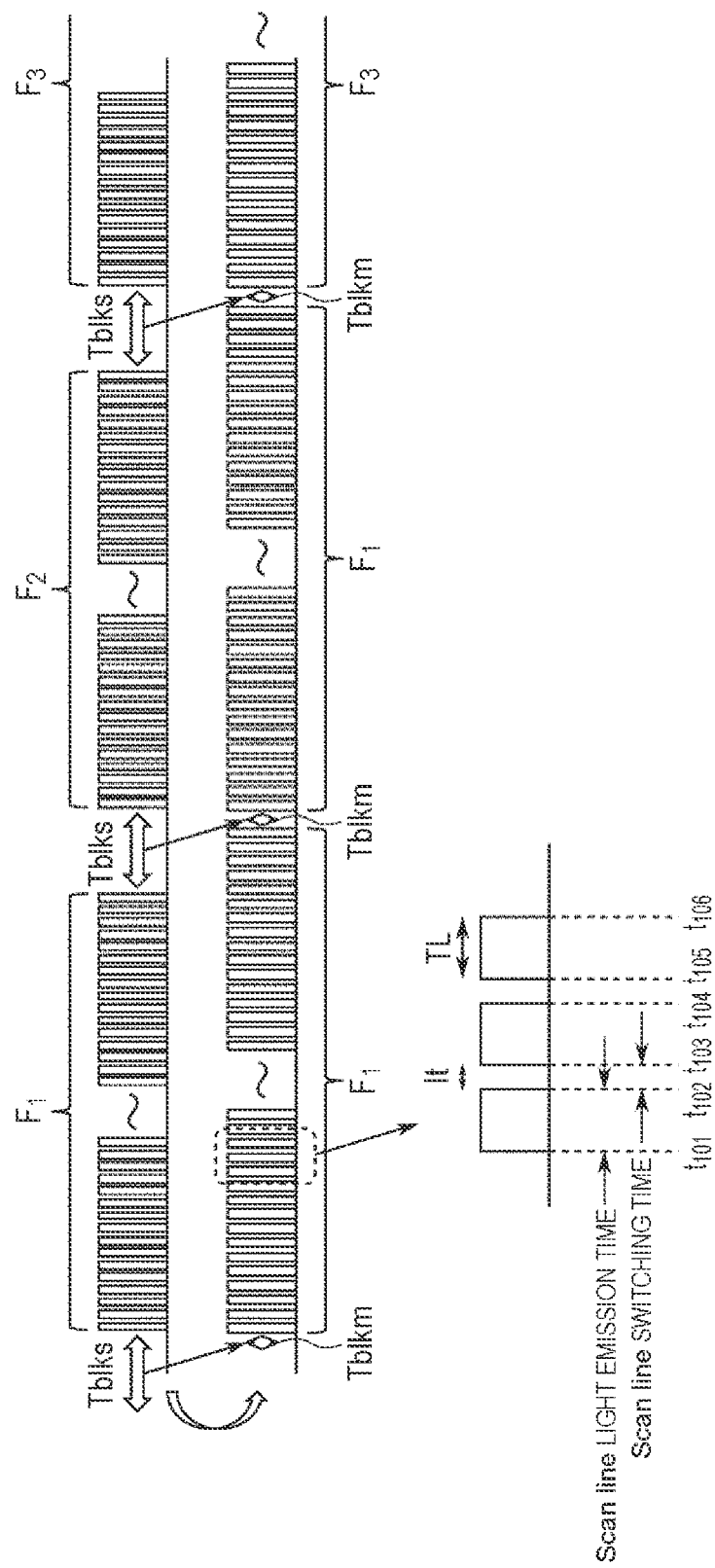
FIG. 12 is a timing chart describing the light emission timing for each row of the LED array.

Waveforms of the current flowing through the LED driver 121 and the MLCC 171 for each frame at this time is expressed by waveforms as depicted in the uppermost and middle parts of FIG. 12. Note that the uppermost part of FIG. 12 is a current waveform for describing the original blanking interval Tblks, and the middle part of FIG. 12 is a current waveform for describing the blanking interval Tblkm of the present disclosure.

Here, for each of the frames F1, F2, . . . , as depicted in the lowermost part of FIG. 12, a fine rectangular waveform represents a light emission time for each Scan line, a space between the rectangular waveforms represents a switching time between Scan lines, and timing at which there is no waveform between the frames F1 and F2 represents the blanking intervals Tblks and Tblkm.

That is, in the lowermost part of FIG. 12, a period from t101 to t102, a period from t103 to t104, and a period from t105 to t106 correspond to the light emission time for each row, and a period from t102 to t103 and a period from t104 to t105 correspond to the switching time between rows.

As described above, the ripple voltage ΔV is generated due to the current becoming substantially zero during the blanking interval Tblks.

Therefore, in the present disclosure, as depicted in the middle part of FIG. 12, setting the blanking interval Tblks to the shorter blanking interval Tblkm (<Tblks) causes the light emission for the next frame to start before the ripple voltage greatly rises to lower the generated ripple voltage ΔV, thereby suppressing the generation of an abnormal sound.

<<7. Setting of Length of Blanking Interval>>

Next, setting of the length of the blanking interval for lowering the ripple voltage ΔV will be described.

Figure 13:
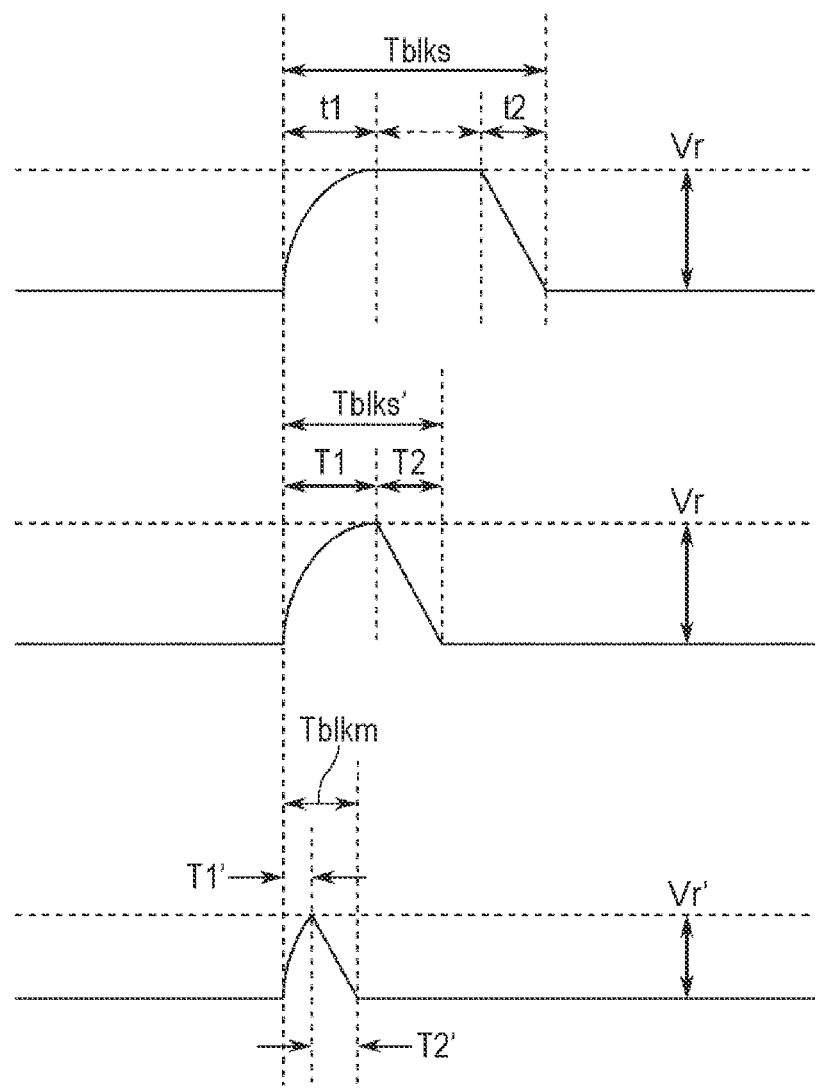
FIG. 13 is a diagram describing how to set the blanking interval.

As depicted in the uppermost part of FIG. 13, the original blanking interval Tblks includes a rising period T1 during which the ripple voltage exponentially rises to a voltage Vr, a steady period indicated by a dotted line during which the voltage Vr remains in a steady state, and a falling period T2 during which the voltage linearly falls, and is set equal to a period of about 5% to 8% of the total light emission period for one entire frame.

In order to lower the ripple voltage, it is necessary to make the blanking interval Tblks shorter; however, for example, as depicted in the middle part of FIG. 13, even when a blanking interval Tblks' is set by eliminating the steady period from the blanking interval Tblks, there no change in the magnitude of the ripple voltage Vr, so that the generation of an abnormal sound cannot be suppressed. Note that when the steady period becomes shorter as in the blanking interval Tblks', the frequency of the generated abnormal sound changes, and the sound range changes accordingly.

In order to lower the ripple voltage Vr to a smaller ripple voltage Vr', for example, as depicted by a rising period T1' in the lower part of FIG. 13, it is necessary to set the shorter blanking interval Tblkm to cause a falling period T2' to start before the ripple voltage rises to the ripple voltage Vr, that is, to cause the light emission for the next frame to start earlier.

Here, a change in the rising period of the ripple voltage and a change in the falling period of the ripple voltage will be considered.

A rising voltage Vru of the ripple voltage during the rising period described above can be expressed by, for example, the following expression (1).

$$Vru = Vr(1 - e(-T1'/\tau))\quad(1)$$

Here, Vru denotes the ripple voltage during the rising period T1 depicted in the upper part of FIG. 13, Vr denotes the maximum value of the ripple voltage in the steady state, and T1' denotes the length of the rising period.

Furthermore, τ denotes a constant (=R·C) including a DC resistance component R as a main component of the impedance Z of the MLCC 171 and the capacitance C.

Moreover, a ripple voltage Vrd during the falling period can be expressed by, for example, the following expression (2).

$$Vrd = I \cdot T2'/C\quad(2)$$

Here, I denotes the value of the current flowing through the LED, T2' denotes the length of the falling period, and C denotes the capacitance of the MLCC 171.

When the maximum value of the ripple voltage is set at Vr/n obtained by reducing the original voltage Vr by 1/n, the rising period T1' and the falling period T2' are obtained as the following expressions (3) and (4), respectively.

$$Vru = Vr/n = Vr(1 - e(-T1'/\tau))\quad(3)$$
$$1/n = 1 - e(-T1'/\tau)$$
$$T1' = -\tau \cdot \ln(1 - 1/n)$$
$$Vrd = Vr/n = I \cdot T2'/C\quad(4)$$
$$T2' = Vr \cdot C/(n \cdot I)$$

Therefore, the blanking interval Tblkm for achieving the voltage Vr/n obtained by lowering the voltage Vr that is the maximum value of the original ripple voltage by 1/n can be set as in the following expression (5).

$$\begin{aligned} Tblkm &= T1' + T2' \\ &= \tau \cdot \ln\left(1 - 1/n\right) + Vr \cdot C/(n \cdot I) \\ &= -R \cdot C \cdot \ln\left(1 - 1/n\right) + Vr \cdot C/(n \cdot I) \\ &= C\left(-R \cdot \ln\left(1 - 1/n\right) + Vr/(n \cdot I)\right) \end{aligned} \quad (5)$$

As described above, the signal processing unit 112 of the driver control unit 91 of the display unit 51 reads, upon startup, the mounting substrate information from the ROM 123, sets the blanking interval Tblkm, as described above, on the basis of the read mounting substrate information, and controls the LED light emission timing by controlling a clock (not depicted) used for the LED PWM control, thereby enabling the blanking interval Tblkm.

Note that, for the setting of the blanking interval Tblkm, n is set as a parameter included in the above-described expression (5), and to what extent the ripple voltage is lowered is determined.

Furthermore, setting the blanking interval as short as possible allows the capacitance C of the MLCC 171 to be set as small as possible, so that it is possible to suppress the generation of an abnormal sound and reduce the cost due to the reduction in the capacitance of the MLCC 171.

Moreover, it is also possible to set, by increasing the capacitance C of the MLCC 171, the blanking interval Tblkm longer while suppressing the generation of an abnormal sound.

Note that, for example, in a case where the impedance R of the MLCC 171 is 40 mΩ, the capacitance C of the MLCC 171 is 2400 uF, the ripple voltage Vr in the steady state is 200 mV, n is 3, and the current I is 4.7 A, when substituted into the expression (5), the blanking interval Tblkm is 73 uS.

In this case, when the frame rate is 60 Hz, the blanking interval Tblkm is about 0.43% of the time required per frame, and when the frame rate is 120 Hz, the blanking interval Tblkm is about 0.86%.

That is, the blanking interval Tblkm is set smaller than a predetermined value on the basis of the impedance R and the capacitance C of the MLCC 171 relative to the time required per frame by applying the above-described expression (5), so that the generation of an abnormal sound can be suppressed.

More specifically, a force F that distorts the MLCC 171 (force that vibrates the substrate 153) is generally expressed by the following expression (6).

$$F = d \cdot \Delta V \quad (N: \text{newton}) \quad (6)$$

Here, d denotes a piezoelectric strain constant that is a constant each MLCC 171 has, and ΔV denotes a given electric field strength, that is, the ripple voltage ΔV.

As described above, the force F that distorts the MLCC 171 vibrates the substrate 153 to generate an abnormal sound. Radiation power W (w) of the generated abnormal sound satisfies a relation expressed by the following expression (7) on the basis of an area of the substrate 153, a vibration speed of the substrate 153, a density of the substrate 153 serving as a medium, and a sound propagation speed in terms of acoustic engineering.

$$W \propto S \cdot (\Delta v \text{ average})^2 \cdot \rho c \quad (w: \text{watt}) \quad (7)$$

Here, S denotes the area of the substrate 153, Δv average denotes the vibration speed of the substrate 153, ρ denotes the density of the substrate 153 serving as a medium, and c denotes the sound propagation speed.

Furthermore, the Δv average of the vibration speed of the substrate 153 is proportional to the force F that distorts the MLCC 171 (force that vibrates the substrate 153), so that a relation of the following expression (8) is satisfied.

$$\Delta v \text{ average} \propto F \quad (8)$$

Here, in terms of Newtonian mechanics, the force F that distorts the MLCC 171 (force that vibrates the substrate 153) is expressed as a product of mass and acceleration (F=m·a (m: mass, a: acceleration), so that the larger the force F that distorts the MLCC 171 (force that vibrates the substrate 153), the larger the acceleration a. As a result, the following relation (9) is satisfied.

$$W \propto S \cdot (F \text{ average})^2 \cdot \rho c = S \cdot (d \cdot \Delta v \text{ average})^2 \cdot \rho c \quad (w: \text{watt}) \quad (9)$$

As described above, the radiation power W (w) of the abnormal sound representing the magnitude of sound is proportional to the square of the ripple voltage ΔV.

Accordingly, in a case where n in the above-described expression (5) is set to 3, the voltage Vr that is the maximum value of the ripple voltage ΔV is ⅓ (=1/n: n=3), and thus, the radiation power W (w) of the abnormal sound representing the magnitude of sound is ⅑ (=(⅓)²).

That is, in the expression (5), the blanking interval is set such that n is set to 3 or more, so that it is possible to make the radiation power W (w) of the abnormal sound representing the magnitude of sound equal to or less than about ⅑ ≈ ¹⁄₁₀, and it is therefore possible to reduce the sound to an unhearable level.

However, there is a control limit for the switching time between Scanlines indicated by the period from t102 to t103 and the period from t104 to t105 depicted in the lowermost part of FIG. 12, so that the blanking interval Tblkm set by the expression (5) cannot be set shorter than the control limit related to the switching time between Scanlines.

In a case where the blanking interval has a length based on the conventional standard, for example, as indicated by a portion surrounded by a dotted line in the left part of FIG. 14, the ripple voltage is generated as the current flowing through the LEDs decreases during the blanking interval.

On the other hand, setting the blanking interval shorter using the method of the present disclosure suppresses the decrease in the current flowing through the LEDs as indicated by a waveform in the right part of FIG. 14, and the generation of the ripple voltage is suppressed accordingly.

As a result, the distortion of the substrate 153 caused by expansion or contraction of the MLCC 171 is eliminated, and the generation of an abnormal sound is suppressed.

Note that FIG. 14 depicts waveforms of the current, the power supply input voltage, the voltage applied to the LED driver 121, and the ground potential in this order from the top.

Furthermore, for example, in a case where the plurality of display units 51 is mounted on the substrate 153, it may be required that the plurality of display units 51 operate in complete synchronization with each other. When the plurality of display units 51 operates in synchronization with each other as described above, it is possible to display a moving high-definition image with higher accuracy. Furthermore, it is possible to display a high-definition image with higher accuracy, so that it is also possible to perform re-imaging or the like with higher accuracy.

On the other hand, when the plurality of display units 51 operates in complete synchronization with each other, setting the blanking interval according to the conventional standard generates a larger ripple voltage $\Delta V$, and a larger abnormal sound is generated accordingly.

However, even when the plurality of display units 51 operates in complete synchronization with each other, as described above, the generation of the ripple voltage $\Delta V$ can be suppressed by making the blanking interval shorter to suppress the generation of the ripple voltage $\Delta V$, so that, according to the technology of the present disclosure, it is also possible to suppress the generation of a larger abnormal sound that occurs when a high definition image is displayed with higher accuracy.

Note that FIG. 11 depicts that the Scan lines 1 to N are displayed once for each frame in time series, and frames sequentially displayed in the order of the frames F1, F2, . . . , but, in actual processing, a process of sequentially displaying the Scan lines 1 to N of the same frame is cyclically repeated a plurality of times. The video signal contains information specifying N, which is the cyclic number or the number of Scan lines, information of the blanking interval specified in the general standard, and the like, and the signal processing unit 112 sets the blanking interval shorter than the blanking interval specified in the general standard with video information containing such pieces of information and the substrate mounting information of the substrate 153 stored in the ROM 123 taken into account.

Furthermore, in the above description, an example has been described where each row where the LEDs 141 are arranged in the horizontal direction is set as a ScanLine, and the LEDs 141 sequentially emits light, row by row (Scanline by Scanline), from top to bottom to display an image as the entire LED display, or alternatively, the LEDs 141 may sequentially emit light, row by row (Scanline by Scanline), from bottom to top.

Alternatively, a configuration may be employed where each column where the LEDs 141 are arranged in the vertical direction is set as a ScanLine, and the LEDs 141 sequentially emit light, column by column (Scanline by Scanline), from right to left or from left to right in the horizontal direction to display an image. That is, the LEDs 141 constituting each ScanLine may correspond to the LEDs 141 arranged in the horizontal direction in one row or may correspond the LEDs 141 arranged in the vertical direction in one column.

<<8. Display Processing>>

Figure 15:
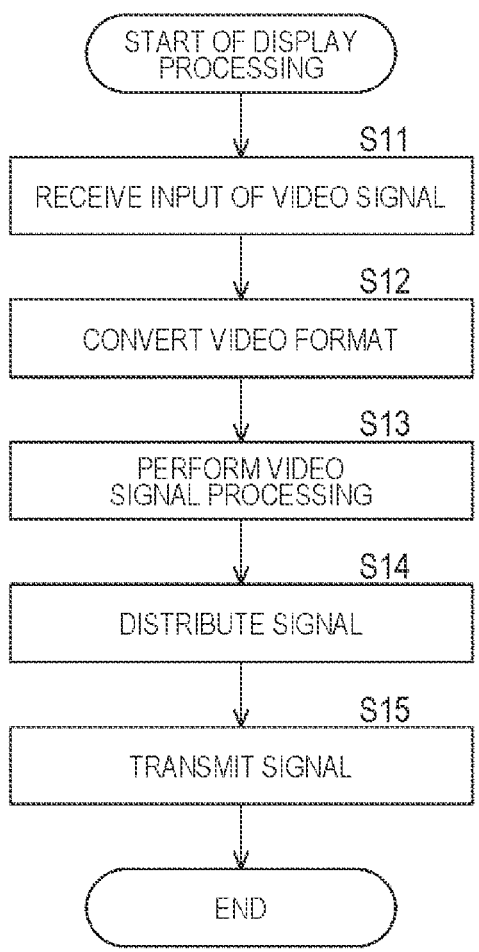
FIG. 15 is a flowchart describing display processing.

Next, display processing performed by the display system 11 in FIG. 1 will be described with reference to a flowchart in FIG. 15.

In step S11, the signal processing unit 78 receives the input of a video signal containing content data and the like supplied from the video server 31 via any one of the HDMI terminal 72, the DP terminal 73, or the DVI terminal 74, and the signal input IF 77.

In step S12, the signal processing unit 78 converts a video format of the received video signal.

In step S13, the signal processing unit 78 receives the input of a control signal supplied from the MPU 76, the control signal being supplied in accordance with a detail of an operation made on the PC 30, and performs signal processing for color temperature, contrast, brightness, and the like.

In step S14, the signal processing unit 78 allocates the video signal subjected to the signal processing to the display units 51-1 to 51-$n$ of the video wall 33, and distributes the video signal among the display units 51-1 to 51-$n$.

In step S15, the signal processing unit 78 transmits the distributed video signal to each corresponding one of the display units 51-1 to 51-$n$ to output the video signal.

Through the above series of processes, the video signal read from the video server 31 is subjected to the signal processing, distributed among the display units 51-1 to 51-$n$ constituting the video wall 33, and transmitted so as to allow the display units 51-1 to 51-$n$ to each display a corresponding image, thereby allowing the video wall 33 to display the entire image of the video content.

<<9. Driver Control Processing by Display Unit>>

Figure 16:
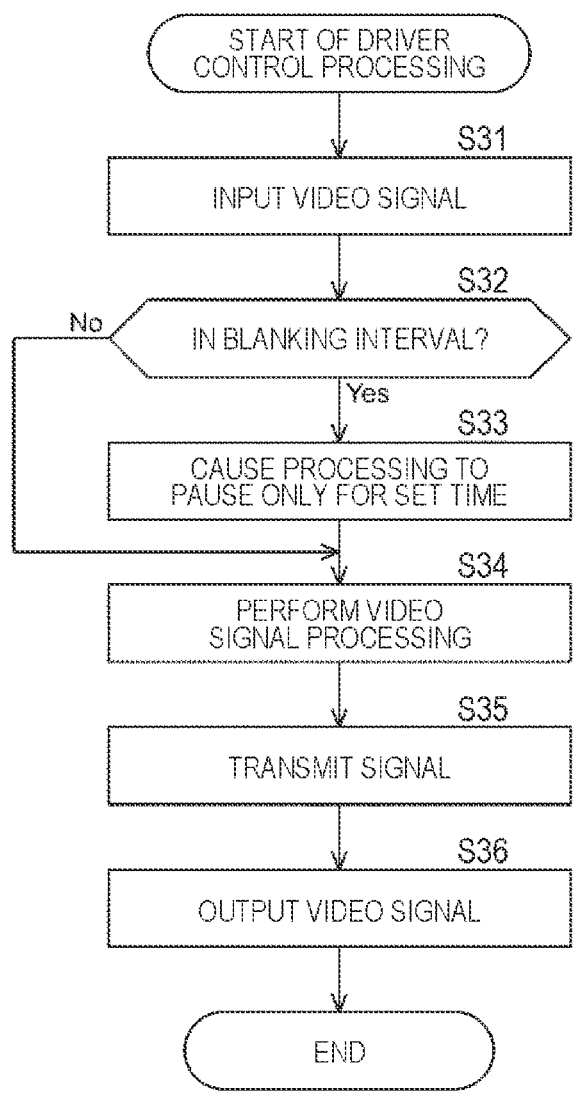
FIG. 16 is a flowchart describing driver control processing.

Next, driver control processing performed by the display unit 51 will be described with reference to a flowchart in FIG. 16.

In step S31, the signal processing unit 112 of the driver control unit 91 of the display unit 51 receives, for each row, the input of the video signal distributed by and supplied from the video wall controller 32 via the signal input IF 111.

In step S32, the signal processing unit 112 determines whether or not it is in the blanking interval. That is, the signal processing unit 112 determines whether or not it is timing to enter the blanking interval on the basis of whether or not the video signal of each line received via the signal input IF 111 is the video signal of the first line of the new frame.

In a case where a determination is made in step S32 that it is in the blanking interval, the processing proceeds to step S33.

In step S33, the signal processing unit 112 causes the processing to pause only for a time set as the length of the blanking interval. The length of the blanking interval set here is, however, a length that can suppress a rise in the ripple voltage $\Delta V$ described above and suppress the generation of an abnormal sound due to distortion of the substrate 153 caused by expansion and contraction of the MLCC 171. That is, the length of the blanking interval set here is set shorter than the length of the blanking interval included in the video signal that is the input signal received via the signal input IF 111, that is, the blanking interval specified in the general standard.

Note that, in a case where a determination is made in step S32 that it is not in the blanking interval, step S33 is skipped.

In step S34, the signal processing unit 112 performs video signal processing of correcting color, luminance, and the like corresponding to each of the display units 51 on the video signal of each line distributed among the display units 51.

In step S35, the signal processing unit 112 allocates the video signal of each line subjected to the video signal processing to the LED drivers 121-1 to 121-N of the LED block 92, and transmits the video signal via a corresponding one of the output IFs 114-1 to 114-N.

In step S36, the LED drivers 121-1 to 121-N of the LED block 92 each perform an LED drive control process on the basis of the video signal of each line and cause a corresponding one of the LED arrays 122-1 to 122-N to display, under the PWM control, an image row by row with appropriate luminance.

Through the above processes, for each of the display units 51 constituting the video wall 33, the appropriate luminance adjustment is performed, and the video signal is output to the LED block 92, thereby allowing an image to be sequentially displayed row by row.

Furthermore, at this time, in a case where the input video signal corresponds to the first line of the new frame, the processing is paused only for the blanking interval set, by the above-described expression (5), shorter than the length of the blanking interval specified in the conventional standard.

As a result, the time required to bring the LEDs into a light-off state in the blanking interval becomes short as compared with the blanking interval specified in the conventional standard, so that it is possible to suppress the generation of the ripple voltage ΔV.

As a result, the application of the ripple voltage ΔV to the MCLL 171 is suppressed, so that it is possible to suppress distortion of the substrates 152 and 153 resulting from expansion or contraction of the MLCC 171 caused by the application of the ripple voltage ΔV to the MLCC 171 and suppress the generation of an abnormal sound.

Furthermore, the blanking time obtained by using the above-described expression (5) is set in proportion to the capacitance C of the MLCC 171, so that it is possible to make the blanking time shorter by reducing the capacitance of the MLCC 171. It is therefore possible to reduce the cost while suppressing the generation of an abnormal sound.

Note that the present disclosure may also have the following configurations.

<1>
A drive control device including a light emission control unit configured to control light emission of light emitting diodes (LEDs) constituting an LED array, in which
  the light emission control unit performs control to make a length of a period during which the LEDs are off shorter than a time indicated by an input signal.

<2>
The drive control device described in <1>, in which
  the light emission control unit controls the light emission of the LEDs constituting the LED array under a passive-matrix drive scheme by which the light emission is controlled scan line by scan line.

<3>
The drive control device described in <1>, in which
  the period during which the LEDs are off corresponds to a period from when a last line of a previous frame is displayed to when a first line of a next frame is displayed.

<4>
The drive control device described in <1>, in which
  the time indicated by the input signal corresponds to a blanking interval of the input signal.

<5>
The drive control device described in <1>, in which
  the light emission control unit controls the length of the period during which the LEDs are off to change a voltage applied to a capacitor provided on a substrate constituting the device.

<6>
The drive control device described in <5>, in which
  the light emission control unit controls the length of the period during which the LEDs are off to lower the voltage applied to the capacitor to one-third or less.

<7>
The drive control device described in <1>, in which
  the light emission control unit controls the length of the period during which the LEDs are off in accordance with capacitance or impedance of a capacitor provided on a substrate constituting the device.

<8>
The drive control device described in <7>, in which
  the capacitor is a multilayer ceramic capacitor (MLCC).

<9>
The drive control device described in <8>, in which
  the light emission control unit acquires information regarding the capacitor provided on the substrate constituting the device, and controls the length of the period during which the LEDs are off on the basis of the acquired information regarding the capacitor.

<10>
A drive control method including a light emission control step of controlling light emission of light emitting diodes (LEDs) constituting an LED array, in which
  in a process of the light emission control step, a length of a period during which the LEDs are off is controlled to be shorter than a time indicated by an input signal.

<11>
The drive control method described in <10>, in which
  in the process of the light emission control step, the light emission of the LEDs constituting the LED array is controlled under a passive-matrix drive scheme by which the light emission is controlled scan line by scan line.

<12>
The drive control method described in <10>, in which
  the period during which the LEDs are off corresponds to a period from when a last line of a previous frame is displayed to when a first line of a next frame is displayed.

<13>
The drive control method described in <10>, in which
  the time indicated by the input signal corresponds to a blanking interval of the input signal.

<14>
The drive control method described in <10>, in which
  in the process of the light emission control step, the length of the period during which the LEDs are off is controlled to change a voltage applied to a capacitor provided on a substrate constituting the device.

<15>
The drive control method described in <14>, in which
  in the process of the light emission control step, the length of the period during which the LEDs are off is controlled to lower the voltage applied to the capacitor to one-third or less.

<16>
The drive control method described in <10>, in which
  in the process of the light emission control step, the length of the period during which the LEDs are off is controlled in accordance with capacitance or impedance of a capacitor provided on a substrate constituting the device.

<17>
The drive control method described in <16>, in which
  the capacitor is a multilayer ceramic capacitor (MLCC) provided on the substrate constituting the device.

<18>
The drive control method described in <17>, in which
  in the process of the light emission control step, information regarding the capacitor provided on the substrate constituting the device is acquired, and the length of the period during which the LEDs are off is controlled on the basis of the acquired information regarding the capacitor.

<19>
An information processing system including:
a display including display units, each of the display units including light emitting diodes (LEDs) arranged in an array and a drive control device configured to control driving of the LEDs; and
a distributor configured to receive input of a video signal, perform predetermined signal processing on the video signal, and distribute the video signal among the display units, in which
the drive control device includes
a light emission control unit configured to control light emission of the LEDs, and
the light emission control unit performs control to make a length of a period during which the LEDs are off shorter than a time indicated by an input signal.

<20>
An information processing method for an information processing system, the information processing system including:
a display including display units, each of the display units including light emitting diodes (LEDs) arranged in an array and a drive control device configured to control driving of the LEDs; and
a distributor configured to receive input of a video signal, perform predetermined signal processing on the video signal, and distribute the video signal among the display units,
the information processing method including a light emission control step of controlling light emission of the LEDs by the drive control device, in which
in a process of the light emission control step, a length of a period during which the LEDs are off is controlled to be shorter than a time indicated by an input signal.

REFERENCE SIGNS LIST

11 Display system
30 PC
31 Video server
32 Video wall controller
33 Video wall
51, 51-1 to 51-n Display unit
78 Signal processing unit
91 Driver control unit
92 Driver block
112 Signal processing unit
121, 121-1 to 121-N Drive circuit
122 Pixel array
151 AC power supply device
152, 153 Substrate/wiring
161, 162 Wiring
171 MLCC
172 Connecting part

The invention claimed is:
1. A drive control device, comprising:
a plurality of light emitting diodes (LEDs) configured to emit light, wherein the plurality of LEDs constitutes an LED array; and
circuitry configured to:
receive an input signal that includes a specific time;
control the emission of the light through the plurality of LEDs; and
control a length of a specific period, wherein
the controlled length of the specific period is shorter than the specific time, and
the plurality of LEDs is off in the specific period.

2. The drive control device according to claim 1, wherein
the circuitry is further configured to control the emission of the light through the plurality of LEDs based on a passive-matrix drive scheme, and
the passive-matrix drive scheme is associated with a scan line.

3. The drive control device according to claim 1, wherein
the specific period corresponds to a period between a display of a last line of a first frame and a display of a first line of a second frame.

4. The drive control device according to claim 1, wherein
the specific time corresponds to a blanking interval of the input signal.

5. The drive control device according to claim 1, wherein
the circuitry is further configured to control the length of the specific period to change a first voltage that is applied to a capacitor,
the capacitor is on a substrate, and
the substrate includes the drive control device.

6. The drive control device according to claim 5, wherein
the circuitry is further configured to control the length of the specific period to lower the first voltage,
the first voltage applied to the capacitor is less than or equal to one-third of a second voltage, and
the second voltage is applied to the capacitor based on the specific time.

7. The drive control device according to claim 1, wherein
the circuitry is further configured to control the length of the specific period based on one of a capacitance associated with a capacitor or an impedance associated with the capacitor,
the capacitor is on a substrate, and
the substrate includes the drive control device.

8. The drive control device according to claim 7, wherein
the capacitor is a multilayer ceramic capacitor (MLCC).

9. The drive control device according to claim 8, wherein
the circuitry is further configured to:
acquire information associated with the capacitor; and
control the length of the specific period based on the acquired information.

10. A drive control method, comprising:
in a drive control device:
receiving an input signal that includes a specific time;
controlling an emission of light through a plurality of light emitting diodes (LEDs); and
controlling a length of a specific period, wherein
the controlled length of the specific period is shorter than the specific time, and
the plurality of LEDs is off in the specific period.

11. The drive control method according to claim 10, further comprising:
controlling the emission of the light through the plurality of LEDs based on a passive-matrix drive scheme, wherein
the passive-matrix drive scheme is associated with a scan line.

12. The drive control method according to claim 10, wherein
the specific period corresponds to a period between a display of a last line of a first frame and a display of a first line of a second frame.

13. The drive control method according to claim 10, wherein
the specific time corresponds to a blanking interval of the input signal.

14. The drive control method according to claim 10, further comprising:

controlling the length of the specific period to change a
first voltage that is applied to a capacitor, wherein
the capacitor is on a substrate, and
the substrate includes the drive control device.

15. The drive control method according to claim 14, further comprising:
controlling the length of the specific period to lower the first voltage, wherein
the first voltage applied to the capacitor is less than or equal to one-third of a second voltage, and
the second voltage is applied to the capacitor based on the specific time.

16. The drive control method according to claim 10, further comprising:
controlling the length of the specific period based on one of a capacitance associated with a capacitor or an impedance associated with the capacitor, wherein
the capacitor is on a substrate, and
the substrate includes the drive control device.

17. The drive control method according to claim 16, wherein the capacitor is a multilayer ceramic capacitor (MLCC).

18. The drive control method according to claim 17, further comprising:
acquiring information associated with the capacitor; and
controlling the length of the specific period based on the acquired information.

19. An information processing system, comprising:
a display that includes:
a plurality of display units, wherein
each of the plurality of display units includes a plurality of light emitting diodes (LEDs),
the plurality of LEDs is configured to emit light,
the plurality of LEDs is in an array; and
a drive control device configured to control the plurality of LEDs; and
a display controller configured to:
receive a video signal;
perform a specific signal processing on the video signal; and
transmit the video signal to each of the plurality of display units, wherein the display controller includes circuitry configured to:
receive the video signal that includes an input signal, wherein the input signal includes a specific time;
control the emission of the light through the plurality of LEDs; and
control a length of a specific period, wherein
the controlled length of the specific period is shorter than the specific time, and
the plurality of LEDs is off in the specific period.

20. An information processing method, comprising:
controlling a plurality of light emitting diodes (LEDs);
receiving a video signal, wherein
the video signal includes an input signal, and
the input signal includes a specific time;
performing a specific signal processing on the video signal;
transmitting the video signal to each of a plurality of display units;
controlling emission of the light through the plurality of LEDs; and
controlling a length of a specific period, wherein
the controlled length of the specific period is shorter than the specific time, and
the plurality of LEDs is off in the specific period.

* * * * *